United States Patent
Chang et al.

(10) Patent No.: US 10,671,296 B2
(45) Date of Patent: Jun. 2, 2020

(54) MANAGEMENT SYSTEM FOR MANAGING MEMORY DEVICE AND MANAGEMENT METHOD FOR MANAGING THE SAME

(71) Applicant: MACRONIX INTERNATIONAL CO., LTD., Hsinchu (TW)

(72) Inventors: Hung-Sheng Chang, Taipei (TW); Hsiang-Pang Li, Zhubei (TW); Yuan-Hao Chang, Taipei (TW); Tei-Wei Kuo, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 244 days.

(21) Appl. No.: 15/672,430

(22) Filed: Aug. 9, 2017

(65) Prior Publication Data
US 2019/0050156 A1 Feb. 14, 2019

(51) Int. Cl.
*G06F 3/06* (2006.01)
*G06F 12/02* (2006.01)
*G11C 7/04* (2006.01)

(52) U.S. Cl.
CPC ............ *G06F 3/0614* (2013.01); *G06F 3/064* (2013.01); *G06F 12/0238* (2013.01); *G06F 12/0246* (2013.01); *G11C 7/04* (2013.01); *G06F 3/0679* (2013.01); *G06F 2212/1016* (2013.01); *G06F 2212/1028* (2013.01); *G06F 2212/1036* (2013.01); *G06F 2212/7202* (2013.01);
(Continued)

(58) Field of Classification Search
CPC .............................. G06F 3/064; G06F 3/0653
See application file for complete search history.

(56) References Cited

U.S. PATENT DOCUMENTS

2008/0235433 A1* 9/2008 Chen .................. G06F 12/0246
711/100
2016/0162219 A1 6/2016 Erez
(Continued)

FOREIGN PATENT DOCUMENTS

| TW | 200839510 A | 10/2008 |
| TW | 201351138 A | 12/2013 |
| TW | 201543481 A | 11/2015 |

OTHER PUBLICATIONS

Chinese language office action dated Oct. 26, 2018, issued in application No. 106126865.

*Primary Examiner* — Larry T Mackall
*Assistant Examiner* — Michelle T Bechtold
(74) *Attorney, Agent, or Firm* — McClure, Qualey & Rodack, LLP

(57) ABSTRACT

Disclosed is a management system for managing a memory device having sub-chips each having a container area and a data area. A CPU selects a target sub-chip according to respective temperature of the sub-chips. When the CPU intends to access a first original data in one of the data areas, a hot date tracking device acquires a first original address of the first original data from the CPU. When the first original address is recorded in one of a plurality of tracking layers, the CPU is indicated to access a first copied data corresponding to the first original data in the container area of the target sub-chip according to a current tracking layer recording the first original address. When the first original address is not recorded in the tracking layers, the CPU accesses the first original data in the data area according to the first original address.

6 Claims, 15 Drawing Sheets

(52) U.S. Cl.
CPC ............ *G06F 2212/7205* (2013.01); *G06F 2212/7208* (2013.01); *G06F 2212/7211* (2013.01)

(56) References Cited

U.S. PATENT DOCUMENTS

| | | |
|---|---|---|
| 2016/0179412 A1 | 6/2016 | Camp et al. |
| 2016/0188455 A1 | 6/2016 | Patel |
| 2016/0203854 A1* | 7/2016 | Kim, II ............ G11C 11/40626 365/222 |
| 2016/0225461 A1* | 8/2016 | Tuers ................ G11C 16/3427 |

* cited by examiner

| original address item | access bit item |
|---|---|
| OAD2 | 1 |
| ⋮ | ⋮ |

310_0

↓

| original address item | access bit item |
|---|---|
| OAD2 | 0 |
| ⋮ | ⋮ |

| original address item | access bit item |
|---|---|
| OAD1 | 0 |
| ⋮ | ⋮ |

310_0

↓

| original address item | access bit item |
|---|---|
| OAD1 | 1 |
| ⋮ | ⋮ |

MANAGEMENT SYSTEM FOR MANAGING MEMORY DEVICE AND MANAGEMENT METHOD FOR MANAGING THE SAME

BACKGROUND OF THE INVENTION

Field of the Invention

The invention relates to a management system for memory device and management method for the same.

Description of the Related Art

Memories can be applied to various electronic devices. Memories can be classified into volatile memory and non-volatile memory (NVM). Some kinds of NVM, e.g. flash memory or phase-change memory (PCM), has thermal effect. Thermal effect may influence the endurance and write capability of the memory. For example, a memory chip with high temperature may have higher endurance and lower power consumption.

Therefore, how to make a good use of thermal effect of memories becomes an important subject.

SUMMARY OF THE INVENTION

The embodiment of the present invention discloses a management system for managing a memory device. The memory device has a plurality of sub-chips. Each sub-chip has a container area and a data area. The management system comprises a CPU and a hot data tracking device. The CPU is coupled to the memory device. The CPU selects a target sub-chip among the sub-chips according to the respective temperature of the sub-chips. The hot data tracking device is coupled to the CPU. The hot data tracking device comprises a plurality of tracking layers. When the CPU intends to access a first original data in one of the data areas, the hot date tracking device acquires a first original address of the first original data from the CPU. When the hot data tracking device determines that the first original address is recorded in one of the tracking layers, the hot data tracking device indicates the CPU to access a first copied data corresponding to the first original data in the container area of the target sub-chip according to a current tracking layer of the tracking layers recorded the first original address. When the hot data tracking device determines that the first original address is not recorded in the tracking layers, the CPU accesses the first original data in the data area according to the first original address.

The embodiment of the present invention discloses a management method for managing a memory device. The memory device has a plurality of sub-chips. Each sub-chip has a container area and a data area. The management method comprises following steps: a CPU selecting a target sub-chip among the sub-chips according to the temperature of the sub-chips respectively; when the CPU intending to access a first original data stored in one of the data areas, a hot data tracking device acquiring a first original address of the first original data; when the hot data tracking device determining that the first original address is recorded in one of the tracking layers, the CPU accessing a first copied data corresponding to the first original data in the container area of the target sub-chip according to a current tracking layer of the tracking layers recorded the first original address; when the hot data tracking device determining that the first original address is not recorded in the tracking layers, the CPU accessing the first original data in the data area according to the first original address.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIGS. 5~15 show operation diagrams illustrating a management method for a memory device according to the embodiment of the present invention.

DETAILED DESCRIPTION OF THE INVENTION

Figure 1:
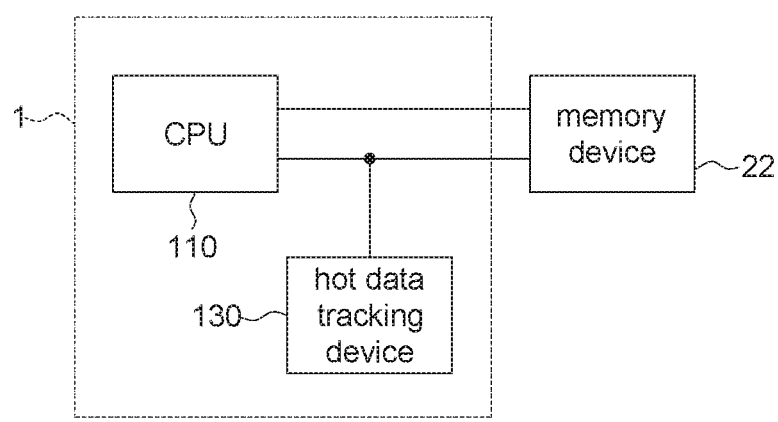
FIG. 1 shows a block diagram illustrating a management system for a memory device according to the embodiment of the present invention.

Referring to FIG. 1, FIG. 1 shows a block diagram illustrating a management system for a memory device according to the embodiment of the present invention. As shown in FIG. 1, a management system 1 according to the embodiment of the present invention is used to manage a memory device 22. The management system 1 includes a central processing unit (CPU) 110 and a hot data tracking device 130. The CPU 110 is coupled to the memory device 22 and the hot data tracking device 130.

The "hot data" in the embodiment of the present invention refers to data which is accessed frequently. Additionally, the "potential hot data" described below refers to data which may be determined to be hot data in future, but is currently not yet. The hot data tracking device 130 may be used to track hot data, to determine whether potential hot data is allowed to be upgraded to hot data according to the access frequency of potential hot data, or to downgrade hot data to potential hot data according to the access frequency of hot data, or to downgrade potential hot data to normal data according to the access frequency of potential hot data. The hot data tracking device 130 may grade the hot level of hot data according to the data access frequency. In other words, the higher data access frequency, the higher hot level. Thus, in accessing hot data with higher hot level, the CPU 110 may use higher programming speed to enhance the access speed. The details of the hot data tracking device 130 will be described in below.

Figure 2:
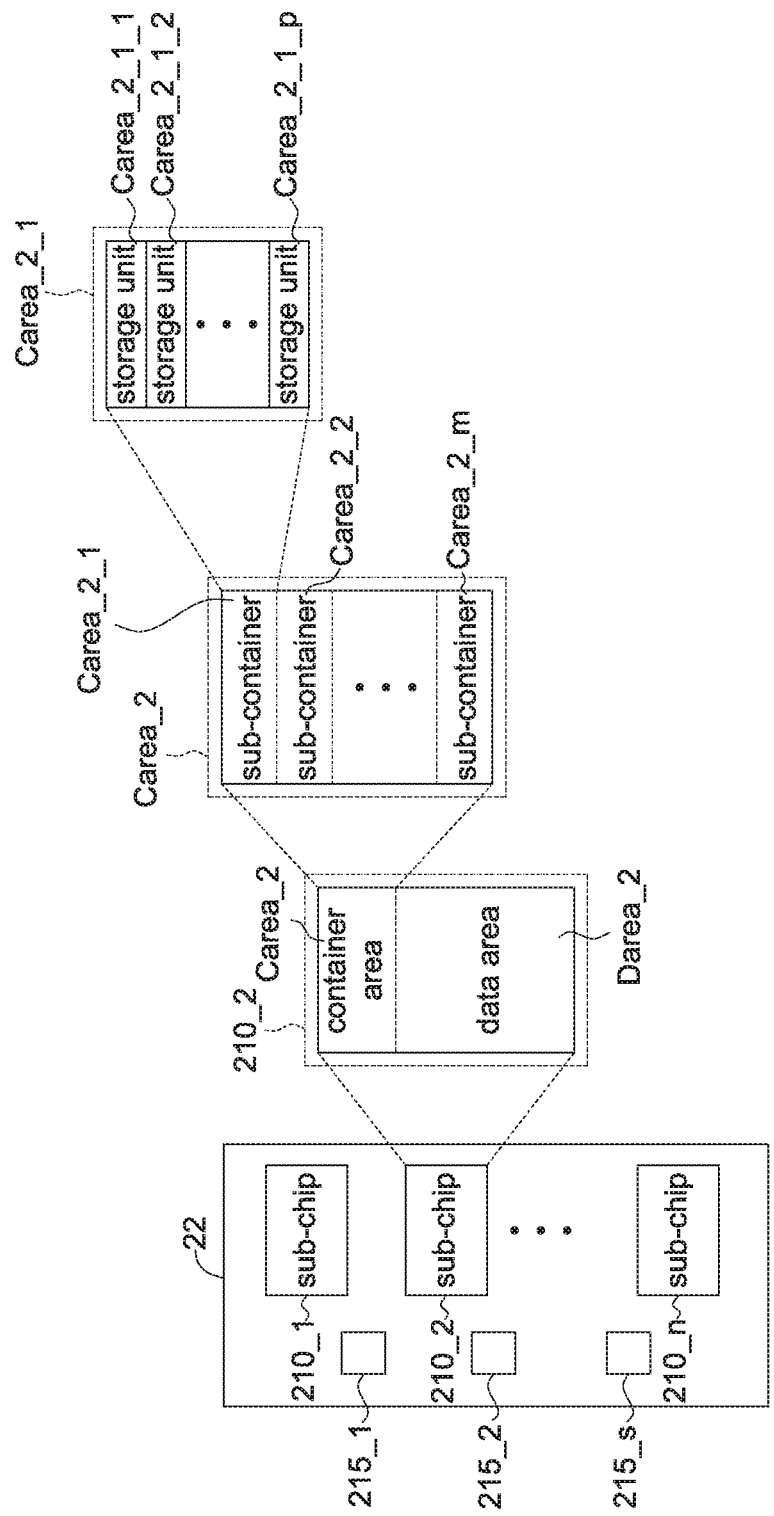
FIG. 2 shows a block diagram illustrating a memory device according to the embodiment of the present invention.

Referring to FIG. 2, FIG. 2 shows a block diagram illustrating a memory device according to the embodiment of the present invention. The memory device 22 comprises a plurality of sub-chips $210\_1$~$210\_n$ (n being a positive integer and representing the number of the sub-chips) and a plurality of thermal sensors $215\_1$~$215\_s$ (s being a positive integer and representing the number of the thermal sensors).

The thermal sensors 215_1~215_s may be used to sense the temperature of the sub-chips 210_1~210_s, and report to the CPU 110.

Referring FIGS. 1 and 2 simultaneously, in the embodiment of the present invention, by virtually setting by the CPU 110, each of the sub-chip 210_1~210_n includes a respective one of container areas Carea_1~Carea_n (not shown) and a respective one of data areas Darea_1~Darea_n (not shown), and each of the container areas Carea_i includes respective sub-containers Carea_i_1~Carea_i_m (m being a positive integer and representing the number of sub-containers in each container area, and i=1, 2, ... n. The CPU 110 virtually sets each sub-container Carea_1_1~Carea_n_m corresponding to a programming mode respectively. The programming mode relates to the programming speed that the CPU 110 programs the sub-containers Carea_1_1~Carea_n_m. The programming mode of each sub-container Carea_1_1~Carea_n_m may be the same or different. For example, the CPU 110 virtually divides the storage space of the sub-chip 210_2 into the container area Carea_2 and the data area Darea_2, and virtually divides the container area Carea_2 into a plurality of sub-containers Carea_2_1~Carea_2_m. The CPU 110 virtually divides each sub-container Carea_2_1~Carea_2_m into a plurality of storage units having the same size. For example, the CPU 110 virtually divides the sub-container Carea_2_1 into a plurality of storage units Carea_2_1_1~Carea_2_1p (p being a positive integer and representing the number of the storage units in each sub-container). Each sub-container Carea_1_1~Carea_n_m comprises the same number of the storage units. The storage unit in the embodiment of the present invention may be for example a cache line and the application is not limited by. The data areas Darea_1~Darea_n in each sub-chip 210_1~210_n may be used to store original data. Each of original data has a corresponding original address. An original address of an original data represents the memory address where the original data is stored in. For example, when a first original data stored in the data area Darea_2 is upgraded from "potential hot data" to "hot data" by the hot data tracking device 130, the CPU 110 copies the first original data (which becomes a hot data) to the container area of the target sub-chip, and accesses the copied data (i.e., first copied data) of the first original data (which is already a hot data) in the container area of the target sub-chip, rather than accessing the first original data in the data area Darea_2. When the first original data is downgraded from "hot data" to "potential hot data", the CPU 110 writes back the first copied data (may be programmed and be different to the first original data) from the container area of the target sub-chip to the data area Darea_2 and overwrites the first original data, and thereinafter, the CPU 110 accesses the first original data (which is not hot data) in the data area Darea_2, rather than accessing the first original data in the container area of the target sub-chip.

Additionally, in an example, among the sub-containers Carea_i_1~Carea_i_m, from the sub-container Carea_i_1 to the sub-container Carea_i_m, the respective programming speed is increasing. The present invention is not limited thereto.

Figure 3A:
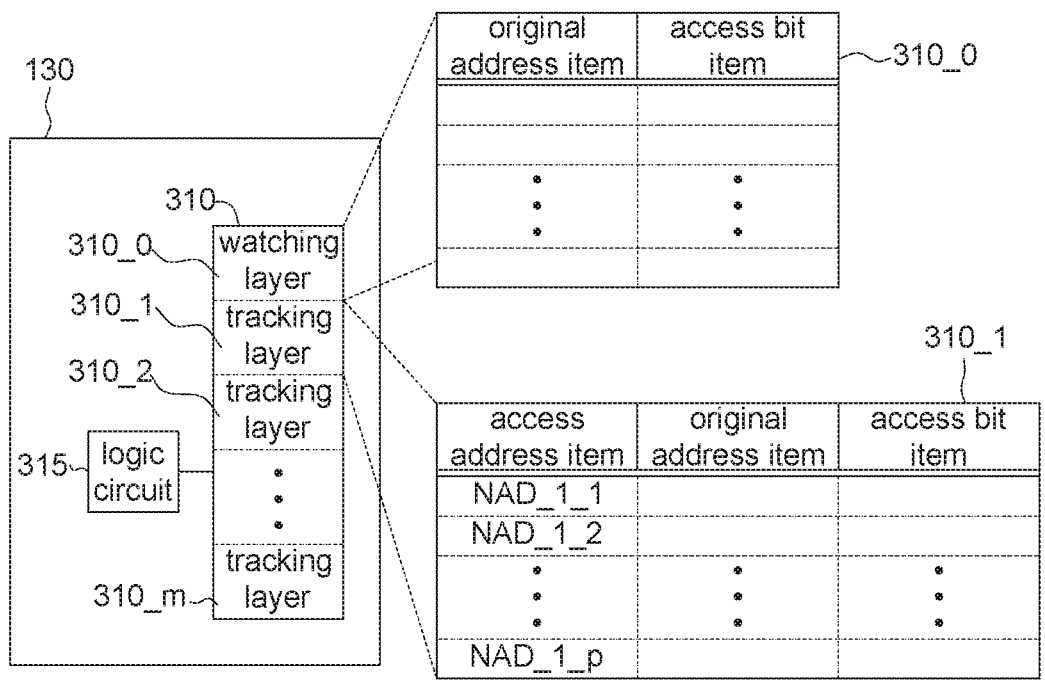
FIG. 3A shows a block diagram illustrating a hot data tracking device according to the embodiment of the present invention.

Referring to FIG. 3A, FIG. 3A shows a block diagram illustrating a hot data tracking device according to the embodiment of the present invention. The hot data tracking device 130 comprises a working memory 310 and a logic circuit 315. The logic circuit 315 is coupled to the working memory 310 and the CPU 110. The CPU 110 may be coupled to the memory device 22, for example, through an address bus and a data bus. The CPU 110 is further coupled to the hot data tracking device 130 through the address bus.

The working memory 310 is virtually divided into a watching layer 310_0 and a plurality of tracking layers 310_1~310_m. The tracking layers 310_1~310_m and the sub-containers Carea_i_1~Carea_i_m of each sub-chip 210_i may have the same number, and are one to one mapping. For example, the tracking layer 310_1 is mapping to the sub-container Carea_i_1, the tracking layer 310_2 is mapping to the sub-container Carea_i_2, etc.

The watching layer 310_0 includes a plurality of watching columns. Each watching column includes an original address item and an access bit item. The original address items of the watching columns are used to record the original address of potential hot data. In other words, when an original data is determined as potential hot data, the original address (in one of the data areas Darea_1~Darea_n) of the original data may be recorded to a corresponding one of the original address items of the watching columns. The access bit items of the watching columns are used to record the access status of potential hot data, and the access bit items may be 0 or 1. When an original data is upgraded to potential hot data, the corresponding access bit may be set to 0; and when the potential hot data is accessed again, the corresponding access bit may be set to 1; if there exists another original data which intends to replace the potential hot data, the corresponding access bit of the potential hot data may be reset from 1 to 0.

The tracking layers 310_1~310_m includes a plurality of tracking columns respectively. Each tracking column includes an access address item, an original address item and an access bit item. The original address items of the tracking columns are used to record the original address of hot data; i.e., when an original data is upgraded to "hot data", the original address (in one of the data areas Darea_1~Darea_n) of the original data may be recorded to one of the original address items of the tracking columns. The access bit items of the tracking columns are used to record the access status of hot data, and the access bit items may be 0 or 1. When an original data is upgraded to hot data, the corresponding access bit may be set to 0; and when the hot data is accessed again, the corresponding access bit may be set to 1; if there exists another original data which intends to replace the hot data, the corresponding access bit of the hot data may be reset from 1 to 0. The details of the access address item are described with FIG. 3B in below.

Figure 3B:
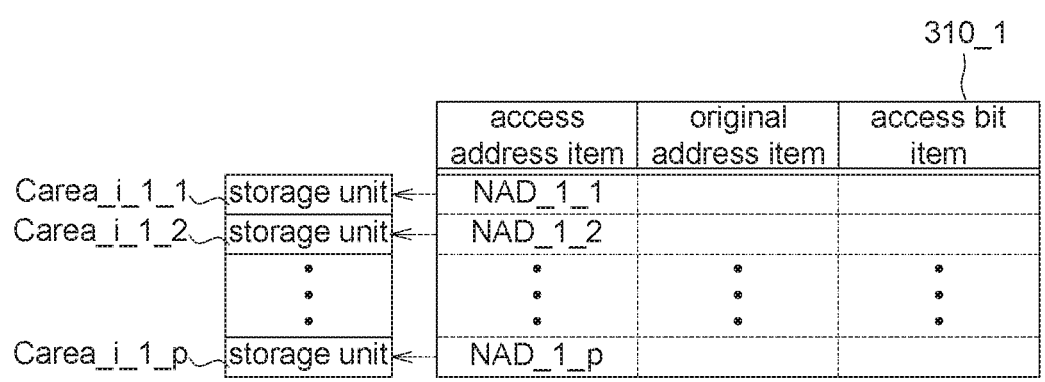
FIG. 3B shows mapping between tracking layers and sub-containers according to the embodiment of the present invention.
Figure 4A:
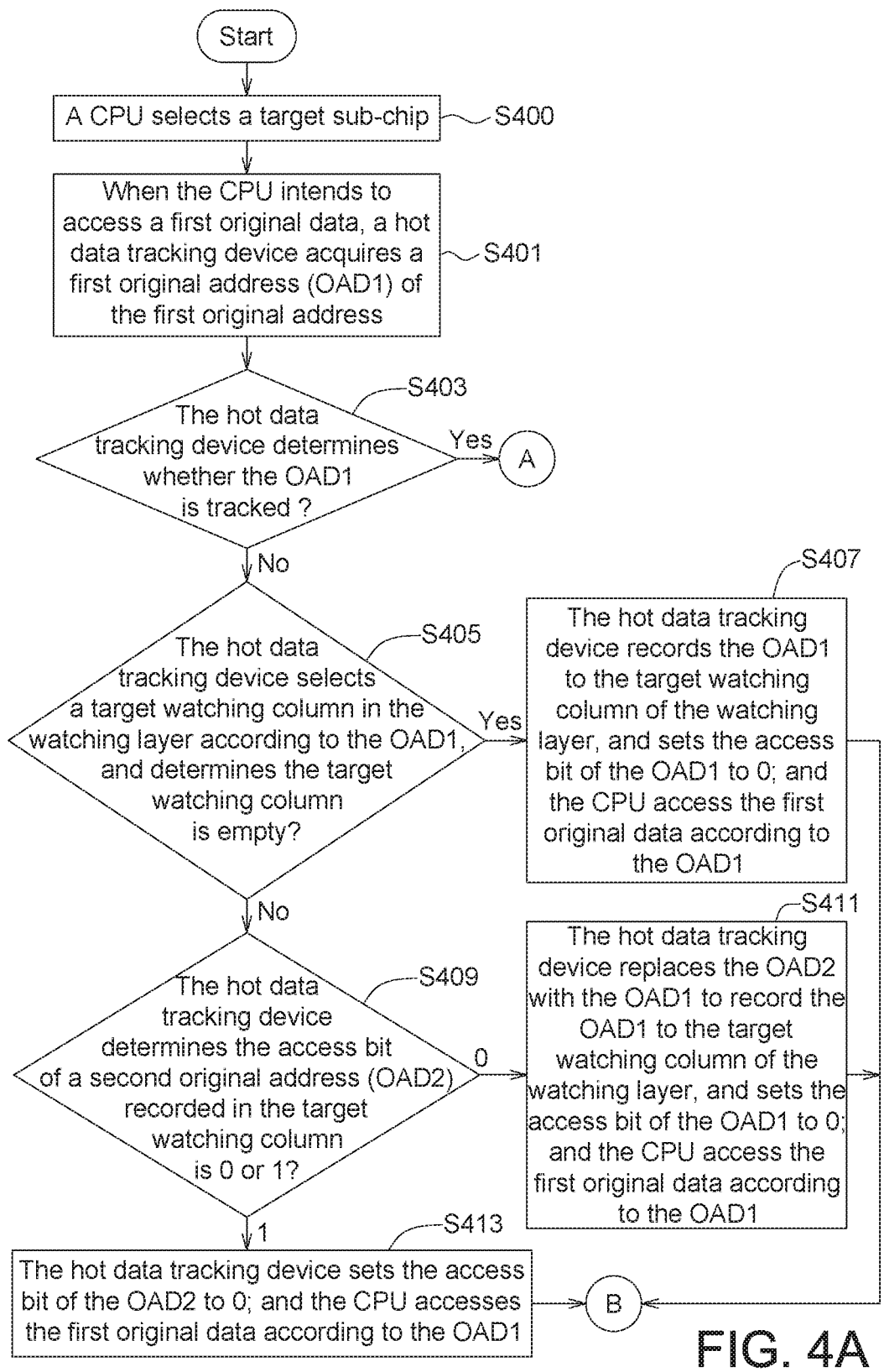
FIGS. 4A-4C show a flow diagram illustrating a management method for a memory device according to the embodiment of the present invention.
Figure 4B:
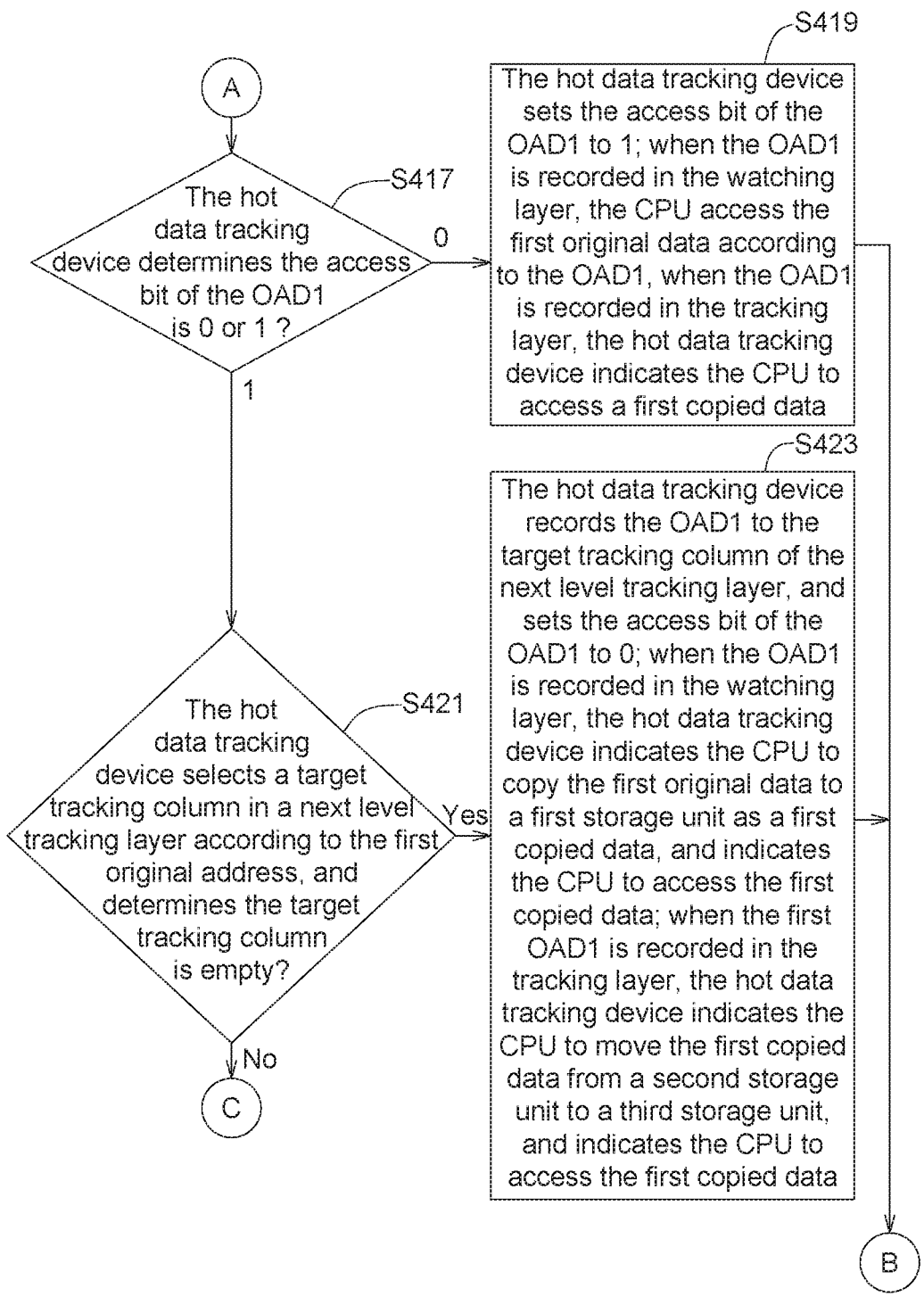
Figure 4C:
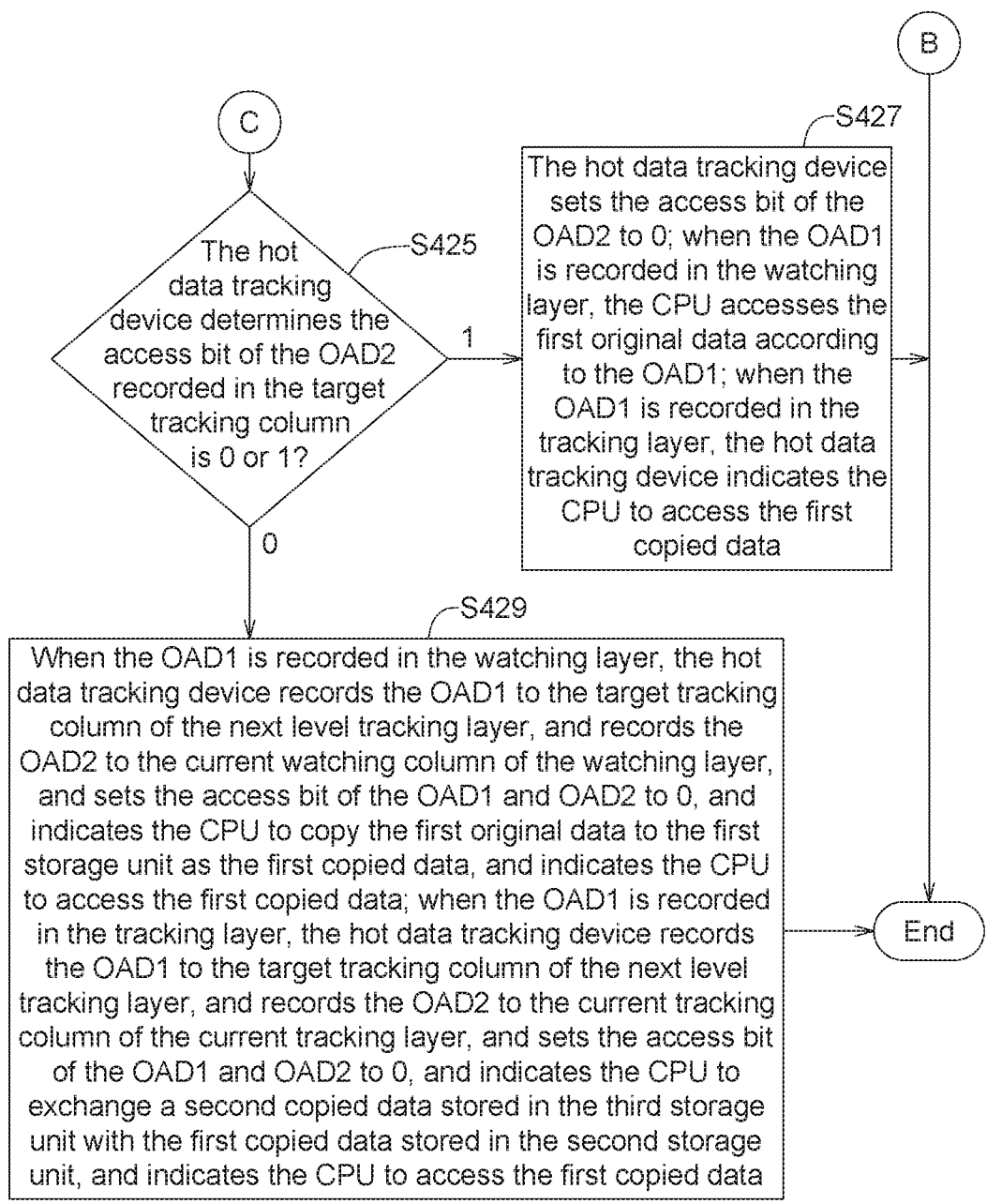

Referring to FIG. 3B, the tracking columns of each tracking layer 310_1~310_m and the storage units Carea_i_j_1~Carea_i_j_p of each sub-container Carea_i_j may have the same number, and are one to one mapping (i=1, 2, ... n; j=1, 2, ... m). Taking the tracking layer 310_1 as an example, if the tracking layer 310_1 is mapping to the sub-container Carea_i_1, the access addresses NAD_1_1~NAD_1_p recorded in the access address items of the tracking layer 310_1 are corresponding to the storage units Carea_i_1_1~Carea_i_p of the sub-container Carea_i_1, respectively. It is to be understood that the access address NAD_j_1 can be a pointer which points to the storage unit Carea_i_j_1, or access address NADj_1 is the memory address of the storage unit Carea_i_j_1. Relative to the original address, the access address is a new address where a copy data of an original data determined as hot data is stored in. For example, when an original data is upgraded from potential hot data to hot data, and the original address of the original data is recorded to the tracking column corresponding to the access address NAD_j_1, the hot data tracking device 130 may indicate the CPU 110 to copy the original data to the storage unit Carea_i_1_1 according to the access address NAD_1_1 as a copied data. When the original address of the original data is still recorded in the tracking column corresponding to the storage unit Carea_i_1_1, and the CPU intends to access the original data, the hot data tracking device 130 may indicate the CPU 110 to access the copied data in the storage unit Carea_i_1_1; i.e., the CPU 110 programs the copied data, not the original data.

The above description is intended to give a general description of the spirit of the present invention. Referring to FIGS. 4A-4C and FIGS. 1-3B, the details of a management method for memory device according to the embodiment of the present invention is described in below.

In step S400, the CPU 110 selects a target sub-chip 210_i among the sub-chips 210_1~210_n according to the temperature of the sub-chips 210_1~210_n reported by the thermal sensors 215_1~215_s. In the embodiment, the CPU 110 selects the sub-chip with the highest temperature among the sub-chips 210_1~210_n as the target sub-chip 210_i. If there are several sub-chips with the same highest temperature, the CPU 110 may select randomly or select one with better endurance as the target sub-chip 210_i among the sub-chips with the same highest temperature, where the endurance represents the rest times of the sub-chips 210_1~210_n may be programmed. For example, if the sub-chips 210_1~210_n may be programmed by 10 million times initially (i.e., the maximum endurance of the sub-chips is 10 million times), when the rest times of a sub-chip with the highest temperature may be programmed is a million times (i.e., the sub-chip with the highest temperature has been programmed by 9 million times), the sub-chip may be excluded from a list for selecting the target sub-chip. After the CPU 110 selects the target sub-chip 210_i, the logic circuit 315 of the hot data tracking device 130 maps the tracking layers 310_1~310_m to the sub-containers Carea_i_1~Carea_i_m of the target sub-chip 210_i respectively.

In step S401, when the CPU 110 intends to access a first original data in the memory device 22, the hot data tracking device 130 may acquire a first original address OAD1 of the first original data. The first original data may be stored in the data areas Darea_1~Darea_n of the sub-chip 210_1~210_n. That is, when the CPU 110 intends to access the first original data in the data area Darea_x (x=1, 2, . . . n), the CPU 110 transmits the first original address OAD1 of the first original data to the hot tracking device 130, and the first original address OAD1 is received by the logic circuit 315 of the hot tracking device 130.

In step S403, the hot data tracking device 130 determines whether the first original address OAD1 is tracked. That is, the logic circuit 315 determines whether the first original address OAD1 is recorded in the watching layer 310_0 or in one of the tracking layers 310_1~310_m. When the first original address OAD1 is not tracked, step S405 is executed; and when the first original address OAD1 is tracked, step S407 is executed.

In step S405, the hot data tracking device 130 selects a target watching column among the watching columns in the watching layer 310_0 according to the first original address OAD1, and determines whether the target watching column is empty. More specifically, the logic circuit 315 operates a hash function on the first original address OAD1 to acquire a hash value, and selects the target watching column in the watching layer 310_0 according to the hash value. Then, the logic circuit 315 checks whether the original address item of the target watching column is already occupied by another original address. When there is no other original address recorded in the original address item of the target watching column, the logic circuit 315 determines the target watching column is empty. When another original address is recorded in the original address item of the target watching column, the logic circuit 315 determines the target watching column is not empty. When the logic circuit 315 determines the target watching column is empty, step S407 is executed; and when the logic circuit 315 determines the target watching column is not empty, step S409 is executed.

Figure 5:
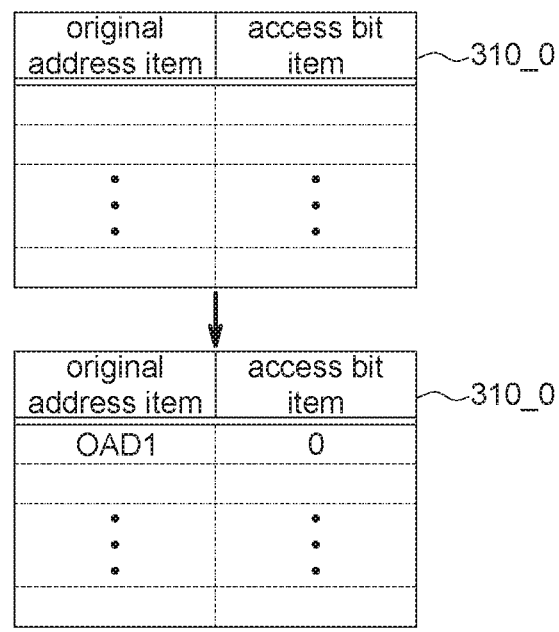

In step S407, the hot data tracking device 130 records the first original address OAD1 to the target watching column in the watching layer 310_0. More specifically, as shown in FIG. 5, when the original address item of the target watching column is empty, the logic circuit 315 can record the first original address OAD1 to the original address item of the target watching column, and sets the access bit corresponding to the first original address OAD1 to 0. In this case, the hot data tracking device 130 won't transmit further indication to the CPU 110, and the CPU 110 may access the first original data according to the first original address.

In step S409, a second original address OAD2 is recorded in the original address item of the target watching column. The hot data tracking device 130 further determines the access bit of the second original address OAD2 recorded in the watching layer 310_0 is 0 or 1. When the access bit of the second original address OAD2 is 0, step S411 is executed; and when the access bit of the second original address OAD2 is 1, step S413 is executed.

Figure 6:
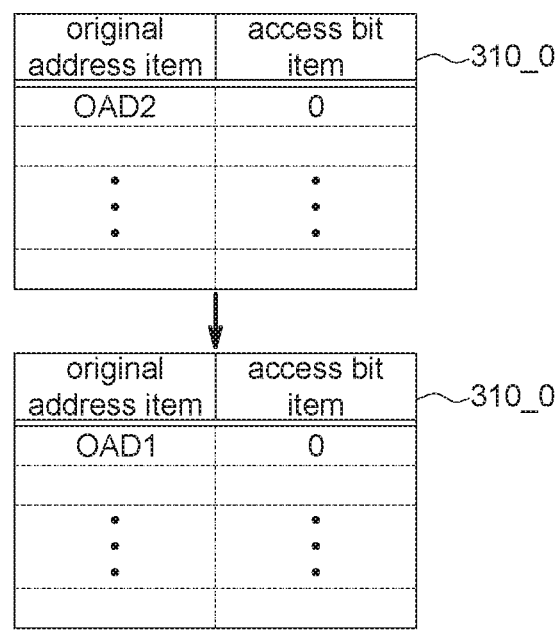

In step S411, when the logic circuit 315 determines the access bit of the second original address OAD2 recorded in the watching layer 310_0 is 0, it means that a second original data at the second original address OAD2 has not been accessed since the access bit has been reset to 0. As shown in FIG. 6, the logic circuit 315 determines the first original data as potential hot data, and replaces the second original address OAD2 with the first original address OAD1; i.e., the logic circuit 315 records the first original address OAD1 to the original address item of the target watching column in the watching layer 310_0, and sets the access bit of the first original address OAD1 to 0. In this case, the hot data tracking device 130 won't transmit further indication to the CPU 110, and the CPU 110 may access the first original data according to the first original address OAD1.

In step S413, when the logic circuit determines the access bit of the second address OAD2 recorded in the watching layer 310_0 is 1, it means that the second original data at the second original address OAD2 has been accessed since the access bit has been reset to 0. As shown in FIG. 7, the logic circuit 315 determines the second original data is still potential hot data, and sets the access bit of the second original address OAD2 to 0. In this case, the hot data tracking device 130 won't transmit further indication to the CPU 110, and the CPU 110 may access the first original data according to the first original address OAD1.

That is, in the embodiment of the present invention, when the first original address OAD1 is not tracked, the logic circuit 315 may intend to record the first original address OAD1 to the watching layer 310_0. When the target watching column of the watching layer 310_0 is empty, the logic circuit 315 records the first original address OAD1 to the target watching column of the watching layer 310_0, and sets the access bit of the first original address OAD1 to 0. When the target watching column of the watching layer 310_0 is not empty (i.e., the second original address OAD2 has been recorded in the target watching column of the watching layer 310_0), and the access bit of the second original address OAD2 is 0, the logic circuit 315 replaces the second original address OAD2 with the first original address OAD1, and sets the access bit of the first original address OAD1 recorded in the watching layer 310_0 to 0. When the target watching column of the watching layer 310_0 is not empty (i.e., the second original address OAD2 is recorded), and the access bit of the second original address OAD2 is 1, the logic circuit 315 resets the access bit of the second original address OAD2 to 0 (but won't record the first original address OAD1 to the target watching column).

When the first original address OAD1 is tracked, it means that the first original address OAD1 may be recorded in a current watching column of the watching layer 310_0, or in a current tracking column of a current tracking layer 310_j (j=1, 2, . . . m). In step S417, no matter the first original address OAD1 is recorded in the watching layer 310_0 or in the current tracking layer 310_j, the logic circuit 315 of the hot data tracking device 130 determines the access bit of the first original address OAD1 is 0 or 1. When the logic circuit determines the access bit of the first original address OAD1 is 0, step S419 is executed; when the logic circuit determines the access bit of the first original address OAD1 is 1, S421 is executed.

In step S419, when the first original address OAD1 is recorded in the watching layer 310_0, as shown is FIG. 8, the logic circuit 315 sets the access bit of the first original address OAD1 recorded in the watching layer 310_0 to 1. The hot data tracking device 130 won't transmit further indication to the CPU 110, and the CPU 110 may access the first original data according to the first original address OAD1.

Figure 9:
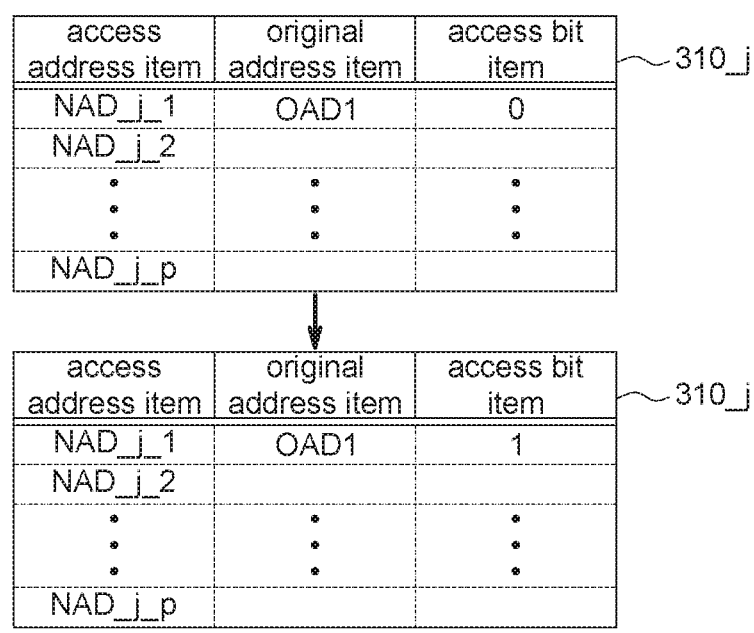

When the first original address OAD1 is recorded in the current tracking layer 310j, as shown is FIG. 9, the logic circuit 315 sets the access bit of the first original address OAD1 recorded in the current tracking layer 310j to 1. The hot data tracking device 130 indicates the CPU 110 to access a first copied data in a second storage unit Carea_i_j_1 (i.e., in the sub-container Carea_i_j of the sub-chip 210_i) according to a first access address NAD_j_1 (i.e., the access address item of the current tracking column) (not to access the first original data according to the first original address OAD1).

Step S419 illustrates two cases. In a first case, the first original address OAD1 is recorded in the watching layer 310_0, and the access bit of the first original address OAD1 is 0. The first case means that the first original data has been determined as potential hot data, but not hot data yet, and the first original data has not been accessed since the access bit has been reset to 0. Therefore, the first original data won't be copied to the container area Carea_i of the target sub-chip 210_i. The CPU 110 still accesses the first original data according to the first original address OAD1. In a second case, the first original address OAD1 is recorded in the current tracking layer 310_j, and the access bit of the first original address OAD1 is 0. The second case means that the first original data has been determined as hot data, and the first original data has been copied to the second storage unit Carea_i_j_1 of the sub-container Carea_i_j, i.e., the first copied data is stored in the second storage unit Carea_i_j_1. Therefore, the hot data tracking device 130 may indicate the CPU 110 to access the first copied data in the second storage unit Carea_i_j_1 according to the first access address NAD_j_1.

In step S421, the logic circuit 315 of the hot data tracking device 130 selects a target tracking column among the tracking columns in a next level tracking layer 310_(j+1) according to the first original address OAD1, and determines whether the target tracking column is empty. In the embodiment of the present invention, the next level tracking layer 310_(j+1) refers to the tracking layer with the hot level higher than the hot level of the current tracking layer 310_j which records the first original address OAD1 by 1. For example, when the first original address OAD1 is recorded in the tracking layer 310_1 with the lowest hot level, the next level tracking layer is the tracking layer 310_2, etc. For the watching layer 310_0, the next level tracking layer is the tracking layer 310_1 with the lowest hot level. It should be noted that when the first original address OAD1 is recorded in the tracking layer 310_m with the highest hot level, due to there is no next level tracking layer, it is no need for the logic circuit 315 to find the target tracking column of the next level tracking layer, and the flow ends. When the target tracking column in the next level tracking layer 310_(j+1) is empty, step S423 is executed: and when the target tracking column in the next level tracking layer 310_(j+1) is not empty, step S425 is executed. For example, the logic circuit 315 operates a hash function on the first original address OAD1 to acquire a hash value, and selects the target tracking column in the next tracking layer 310_(j+1) according to the hash value. Step S421 is used to determine whether the hot level of the first original data is allowed to be upgraded. In other words, when the first original address OAD1 is recorded in the watching layer 310_0, step S421 is used to check whether the first original data is allowed to be upgraded from potential hot data to hot data; and when the first original address OAD1 is recorded in the current tracking layer 310_j, step S421 is used to check whether the hot level of the first original data (which is already hot data) is allowed to be upgraded.

In step S423, the logic circuit 315 of the hot data tracking device 130 records the first original address OAD1 to the target tracking column in the next level tracking layer 310_(j+1), and sets the access bit of the first original address OAD1 recorded in the next level tracking layer 310_(j+1) (i.e., the access bit item of the target tracking column) to 0, and clears the current watching column (the first original address OAD1 was previously recorded in the watching layer 310_0) or clears the current tracking column (the first original address OAD1 was previously recorded in the current tracking layer 310_j). The "clear" described in the embodiment of the present invention refers to delete the items recorded in the original address item and the access bit item of the watching column and/or the tracking column.

Figure 10:
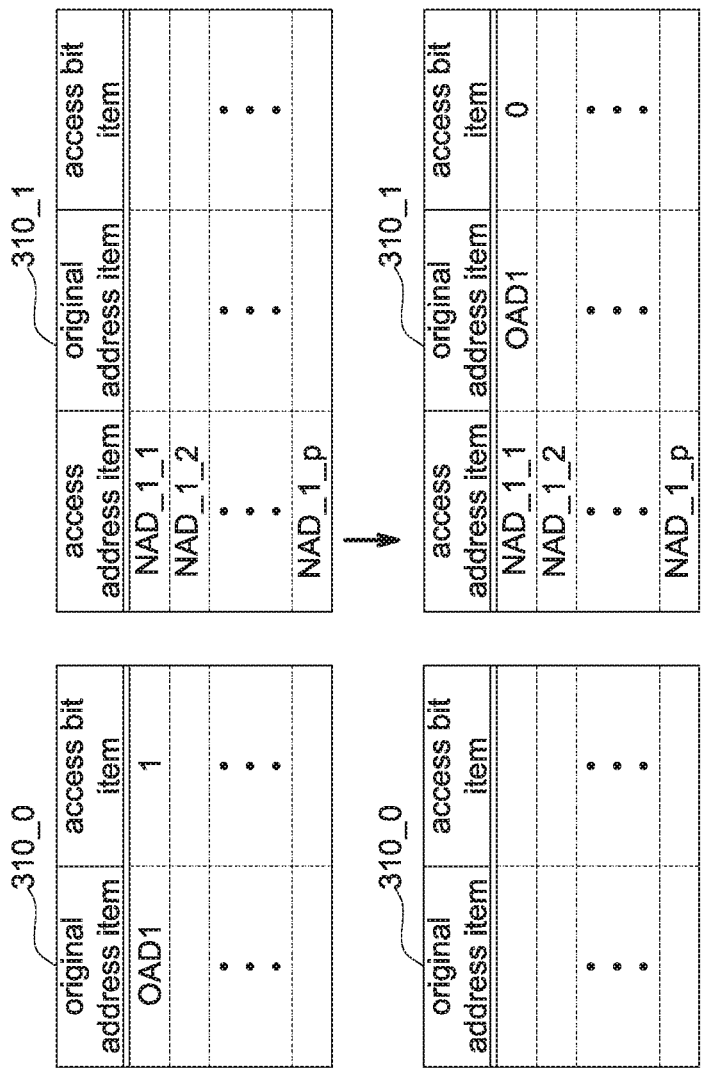

Step S423 illustrates two cases. In a first case, as shown in FIG. 10, the first original address OAD1 is recorded in the watching layer 310_0, and the access bit of the first original address OAD1 is 1. The first case means that the first original data has been determined as potential hot data, and is qualified to be upgraded to hot data. Then, the logic circuit 315 selects the target tracking column in the next level tracking layer (i.e., tracking layer 310_1), and intends to record the first original address OAD1 to the target tracking column of the tracking layer 310_1. When the logic circuit 315 determines the tracking column in the tracking layer 310_1 is empty, the logic circuit 315 may record the first original address OAD1 to the tracking layer 310_1 to upgrade the first original data to hot data. In this case, the hot data tracking device 130 indicates the CPU 110 to copy the first original data to a second storage unit Carea_i_1_1 of the sub-container Carea_i_1 according to the second access address NAD_1_1 recorded in the access address item of the target tracking column of the next level tracking layer as the first copied data, and indicates the CPU 110 to access the first copied data in the first storage unit Carea_i_1_1 of the sub-container Carea_i_1 according to the second access address NAD_1_1.

Figure 11:
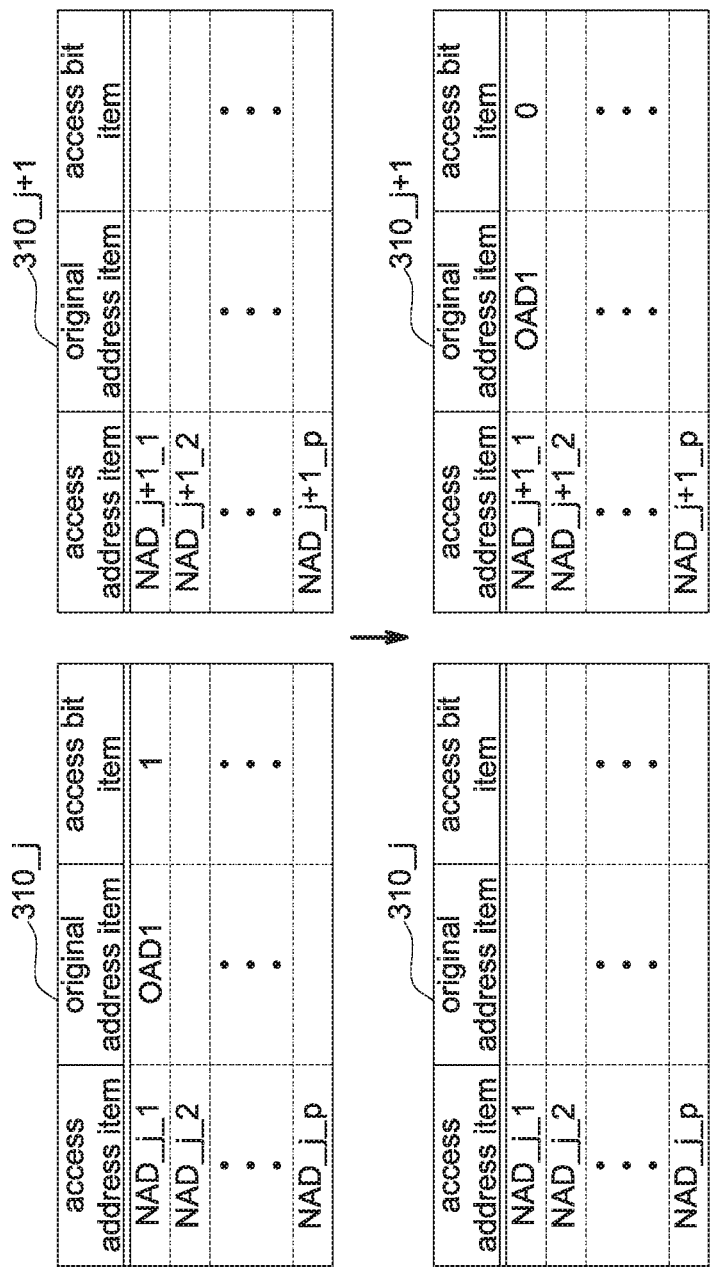

In a second case in step S423, as shown in FIG. 11, the first original address OAD1 is recorded in the current tracking layer 310j, and the access bit of the first original address OAD1 is 1. The second case means that the first original data has been determined as hot data, and is qualified to be upgraded the hot level. The logic circuit 315 selects the target tracking column in the next level tracking layer 310_+1), and intends to record the first original address OAD1 to the target tracking column of the next level tracking layer 310_(j+1). When the logic circuit 315 determines the tracking column in the next level tracking layer 310_(j+1) is empty, the logic circuit 315 may record the first original address OAD1 to the next level tracking layer 310_(j+1) to upgrade the hot level of the first original data. In this case, the hot data tracking device 130 indicates the CPU 110 to move the first copied data in the second storage unit Carea_i_j_1 of the sub-container Carea_i_j to a third storage unit Carea_i_(j+1)_1 of the sub-container Carea_i_(j+1) according to the second access address NAD_(j+1)_1 recorded in the access address item of the target tracking column of the next level tracking layer 310_(j+1), and indicates the CPU 110 to access the first copied data in the third storage unit Carea_i_(j+1)_1 of the sub-container Carea_i_(j+1) according to the second access address NAD_(j+1)_1.

In step S425, when the target tracking column of the next level tracking layer 310_(j+1) is not empty, i.e. the second original address OAD2 has been recorded in the target tracking column of the next level tracking layer 310_(j+1), the logic circuit 315 of the hot data tracking device 130 determines whether the access bit of the second original address OAD2 recorded in the next level tracking layer 310_(j+1) is 0 or 1. When the access bit of the second original address OAD2 is 1, the step S427 is executed; and when the access bit of the second original address OAD2 is 0, the step S429 is executed. Step S425 is used to further determine whether the hot level of the first original data is allowed to be upgraded. In other words, when the first original address OAD1 is recorded in the watching layer 310_0, step S425 is used to further check whether the first original data is allowed to be upgraded from potential hot data to hot data; and when the first original address OAD1 is recorded in the current tracking layer 310_j, step S425 is used to further check whether the hot level of the first original data is allowed to be upgraded.

In step S427, when the first original address OAD1 is recorded in the watching layer 310_0, the logic circuit 315 of the hot data tracking device 130 sets the access bit of the second original address OAD2 recorded in the tracking layer 310_1 to 0, and the hot data tracking device 130 won't transmit further indication to the CPU 110. The CPU 110 accesses the first original data according to the first original address OAD1. When the first original address OAD1 is recorded in the current tracking layer 310j, the logic circuit 315 of the hot data tracking device 130 sets the access bit of the second original address OAD2 recorded in the next level tracking layer 310_(j+1) to 0, and the hot data tracking device 130 indicates the CPU 110 to access the first copied data according to the access address recorded in the access address item of the current tracking column in the current tracking layer 310_j.

Figure 12:
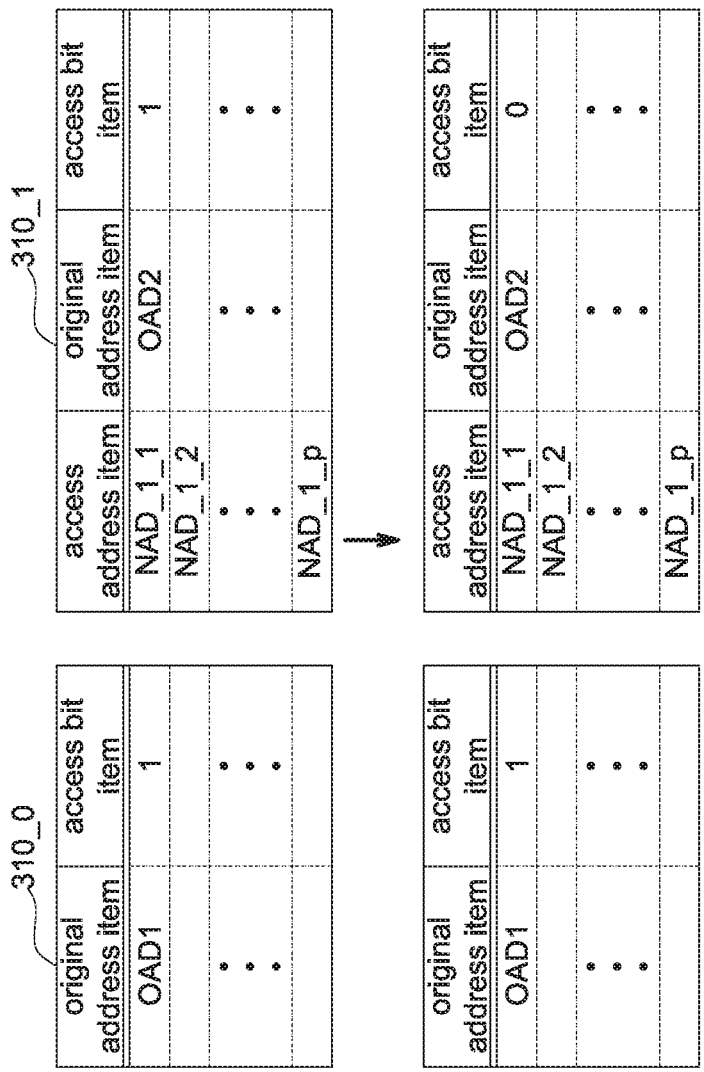

Step S427 illustrates two cases. In a first case, as shown in FIG. 12, the first original address OAD1 is recorded in the watching layer 310_0, and the access bit of the first original address OAD1 is 1. The first case means that the first original data has been determined as potential hot data, and is qualified to be upgraded to hot data. However, the second original address OAD2 has been recorded in the target tracking column in the tracking layer 310_1, and the access bit of the second address OAD2 is 1 (which means the second copied data corresponding to the second original data has been accessed recently). Therefore, the logic circuit 315 resets the access bit of the second original address OAD2 recorded in the tracking layer 310_1 to 0, and keeps the first original data in potential hot data. In this case, the hot data tracking device 130 won't transmit further indication to the CPU 110, and the CPU 110 may access the first original data according to the first original address OAD1.

Figure 13:
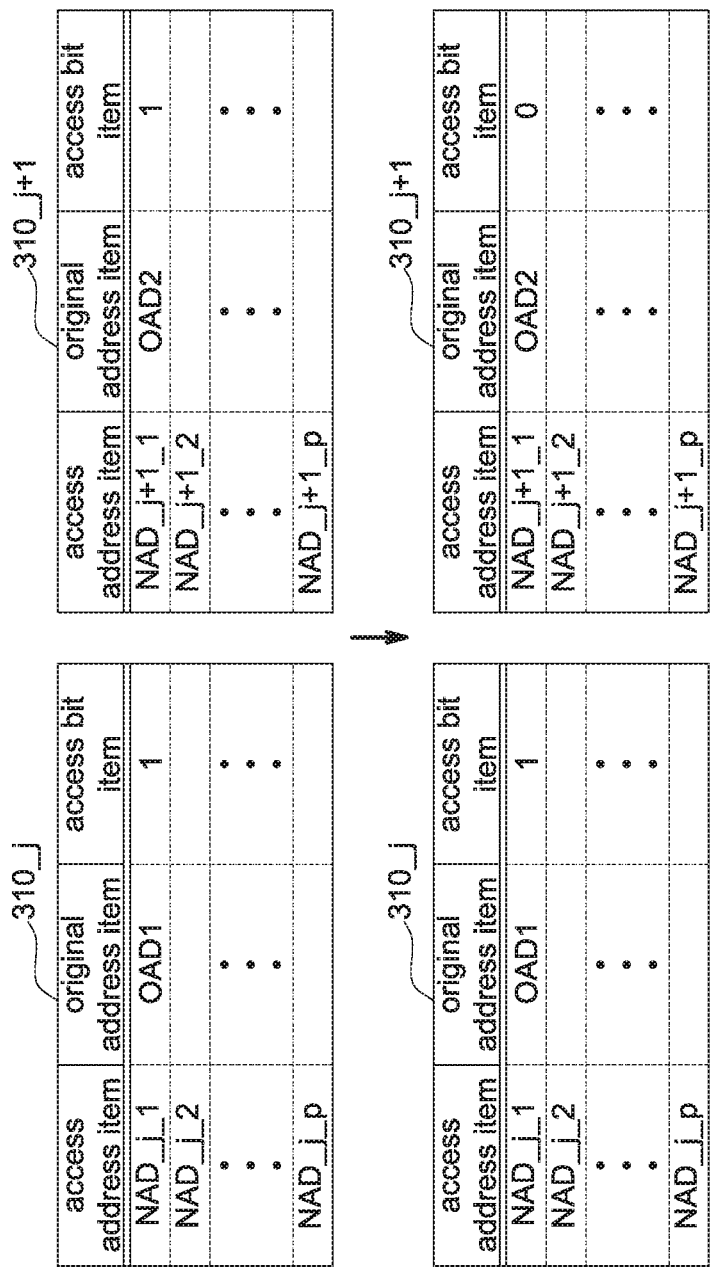

In a second case in step S427, as shown in FIG. 13, the first original address OAD1 is recorded in the current tracking layer 310_j, and the access bit of the first original address OAD1 is 1. The second case means that the first original data has been determined as hot data, and is qualified to be upgraded the hot level. However, the second original address OAD2 has been recorded in the target tracking column in the next level tracking layer 310_(j+1), and the access bit of the second address OAD2 is 1 (which means the second copied data corresponding to the second original data has been accessed recently). Therefore, the logic circuit 315 resets the access bit of the second original address OAD2 recorded in the next level tracking layer 310_(j+1) to 0, and keeps the current hot level of the first original data (i.e. the hot level of the first original data is not upgraded). In this case, the first original data has been copied to the second storage unit Carea_i_j_1 (corresponding to the first access address NAD_j_1), i.e., the first copied data is stored in the second storage unit Carea_i_j_1 of the sub-container Carea_i_j. Therefore, the hot data tracking device 130 may indicates the CPU 110 to access the first copied data in the second storage unit Carea_i_j_1 of the sub-container Carea_i_j according to the first access address NAD_recorded in the current tracking layer 310_j.

In step S429, when the first original address OAD1 is recorded in the watching layer 310_0, the logic circuit 315 of the hot data tracking device 130 exchanges the original address item of the current watching column in the watching layer 310_0 with the original address item of the target tracking column in the tracking layer 310_1, and sets both of the access bit of the first original address OAD1 (which is already in the tracking layer 310_1) and the access bit of the second original address OAD2 (which is already in the watching layer 310_0) to 0. Similarly, when the first original address OAD1 is recorded in the current tracking layer 310_j, the logic circuit 315 of the hot data tracking device 130 exchanges the original address item of the current tracking column in the current tracking layer 310_j with the original address item of the target tracking column in the next level tracking layer 310_(j+1), and sets both of the access bit of the first original address OAD1 (which is already in the tracking layer 310_(j+1)) and the access bit of the second original address OAD2 (which is already in the current tracking layer 310j) to 0.

Figure 14:
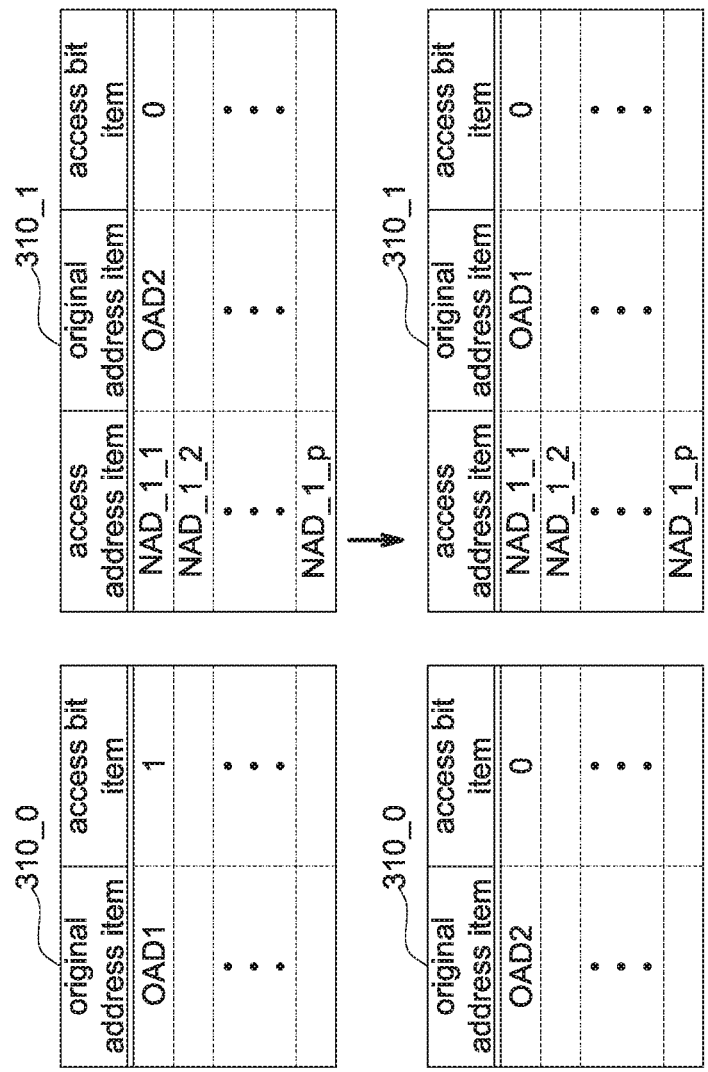

Step S429 illustrates two cases. In a first case, as shown in FIG. 14, the first original address OAD1 is recorded in the watching layer 310_0, and the access bit of the first original address OAD1 is 1. The first case means that the first original data has been determined as potential hot data, and is qualified to be upgraded to hot data. Therefore, the hot data tracking device 130 selects the target tracking column in the tracking layer 310_1 (i.e. the next level tracking layer), and intends to record the first original address OAD1 to the tracking layer 310_1. Due to the second original address OAD2 has been recorded in the target tracking column of the tracking layer 310_1, the logic circuit 315 should check the access bit of the second original address OAD2 to further determined whether the first original address is allowed to be recorded to the tracking layer 310_1. When the logic circuit 315 determines the access bit of the second original address OAD2 is 0, the logic circuit 315 may replace the second original address OAD2 with the first original address OAD1, i.e., recording the first original address OAD1 to the tracking layer 310_1 to upgrade the first original data from potential hot data to hot data. The second original data is downgraded from hot data to potential hot data. In other words, the logic circuit 315 records the first original address OAD1 to the original address item of the target tracking column in the tracking layer 310_1, and records the second original address OAD2 to the original address item of the current watching column in the watching layer 310_0. In this case, the hot data tracking device 130 indicates the CPU 110 to copy the first original data to the first storage unit Carea_i_1_1 of the sub-container_i_1 according to the second access address NAD_1_1 recorded in the access address item of the target tracking column of the tracking layer 310_1 as the first copied data, and indicates the CPU 110 to access the first copied data in the first storage unit Carea_i_1_1 according to the second access address NAD_1_1. Before that, the hot data tracking device 130 may indicate the CPU 110 to write back the second copied data (corresponding to the second original data) stored in the first storage unit Carea_i_1_1 and to overwrite the second original data (which is located at the second original address OAD2).

Figure 15:
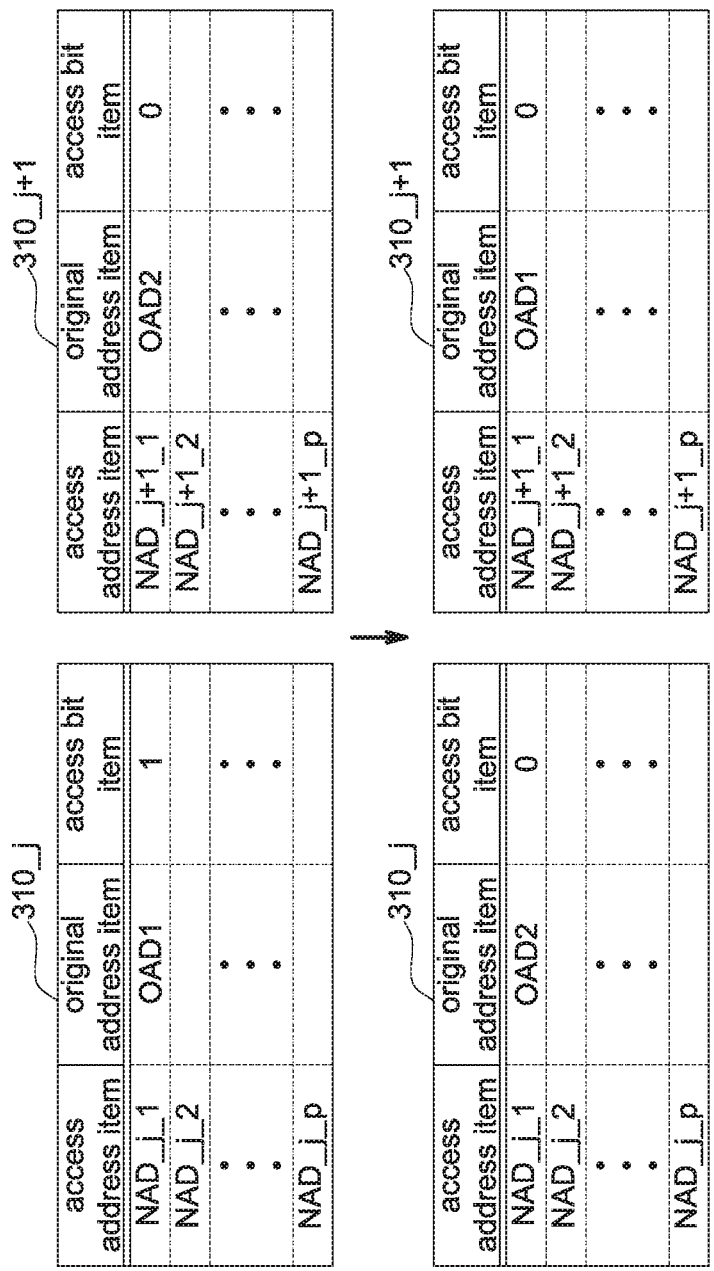

In a second case in step S429, as shown in FIG. 15, the first original address OAD1 is recorded in the current tracking layer 310_j, and the access bit of the first original address OAD1 is 1. The second case means that the first original data has been determined as hot data, and is qualified to be upgraded. Therefore, the hot data tracking device 130 selects the target tracking column in the next level tracking layer 310_(j+1), and intends to record the first original address OAD1 to the tracking layer 310_(j+1). Due to the second original address OAD2 has been recorded in the target tracking column, the logic circuit 315 should check the access bit of the second original address OAD2 to further determined whether the first original address could be recorded to the next level tracking layer 310_(j+1). When the logic circuit 315 determines the access bit of the second original address OAD2 is 0, the logic circuit 315 may replace the second original address OAD2 with the first original address OAD1, i.e., recording the first original address OAD1 to the next level tracking layer 310_(j+1) to upgrade the hot level of the first original data by 1. The hot level of the second original data is downgraded by 1. In other words, the logic circuit 315 records the first original address OAD1 to the original address item of the target tracking column in the next level tracking layer 310_(j+1), and records the second original address OAD2 to the original address item of the current tracking column in the current tracking layer 310_j. In this case, the hot data tracking device 130 indicates the CPU 110 to exchange the second copied data (corresponding to the second original data) stored in the third storage unit Carea_i_(j+1)_1 of the sub-container Carea_i_(j+1) with the first copied data stored (corresponding to the first original data) in the second storage unit Carea_i_j_1 of the sub-container Carea_i_j according to the second access address NAD_(j+1)_1 recorded in the access address item of the target tracking column of the next level tracking layer 310_(j+1) and the first access address NAD_j_1 recorded in the access address item of the current tracking column of the current tracking layer 310_j, and indicates the CPU 110 to access the first copied data in the third storage unit Carea_i_(j+1)_1 of the sub-container Carea_i_(j+1) according to the second access address NAD_(j+)_1.

It should be noted that the logic circuit 315 may be a dedicated circuit for tracking hot data. When the CPU 110 tries to access hot data, the time period from the moment that the first original address OAD1 is received by the hot data tracking device 130 to the moment that the indications is transmitted to the CPU 110 from the hot data tracking device 130 may be far less than the access time of the memory. That is, the hot data tracking device 130 may transmit the indications timely to the CPU 110 to indicate the CPU 110 to access the copied data in the correspond storage unit, rather than accessing the original data in the data area.

According to the embodiment of the present invention, when the hot data tracking device 130 determines an original data is hot data, the hot data tracking device 130 may indicate the CPU 110 to copy the original data to the container area of the sub-chip with the highest temperature a copied data of the original data, and indicate the CPU 110 to access the copied data in the container area. Therefore, the CPU 110 can access the copied data with lower power consumption. Moreover, for the hot data with higher hot level, the CPU 110 can access with higher programming speed to improve the overall performance. In other words, the embodiment of the present invention makes good use of the thermal effect of the memory device to decrease the power consumption, shorten the programming time, improve the overall performance, and extend the life time of the memory device 22.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A management system for managing a memory device, the memory device having a plurality of sub-chips, each of the sub-chips comprising a container area and a data area, the management system comprising:
a central processing unit (CPU) coupled to the memory device, the CPU selecting a target sub-chip among the sub-chips according to respective temperature of the sub-chips;
a hot data tracking device coupled to the CPU, the hot data tracking device comprising a plurality of tracking layers and a watching layer,
wherein, when the CPU intends to access a first original data stored in one of the data areas,
the hot data tracking device acquires a first original address of the first original data from the CPU;
when the hot data tracking device determines that the first original address is recorded in one of the tracking layers, the hot data tracking device indicates the CPU to access a first copied data corresponding to the first original data from the container area of the target sub-chip according to a current tracking layer of the tracking layers recording the first original address; and
when the hot data tracking device determines that the first original address is not recorded in the tracking layers, the CPU reads the first original data in the data area from the first original address;
wherein, the CPU sets a plurality of sub-containers in each of the container areas; and
the tracking layers and the sub-containers have the same number, and are one to one mapping;
wherein, each of the sub-containers comprises a plurality of storage units;
the watching layer comprises a plurality of watching columns, each of the watching columns comprises an original address item and an access bit item;
each of the tracking layers comprises a plurality of tracking columns, each of the tracking columns comprises an access address item, an original address item and an access bit item; and
the tracking columns of each of the tracking layers and the storage units of each of the sub-containers have the same number, and are one to one mapping; and
wherein, when the hot data tracking device determines the first original address is not recorded in the hot data tracking device, the hot data tracking device selects a target watching column among the watching columns of the watching layer by utilizing a hash value of the first original address, and determines whether the target watching column of the watching layer is empty;
when the target watching column of the watching layer is empty, the hot data tracking device records the first original address to the original address item of the target watching column of the watching layer, and sets the access bit of the first original address recorded in the watching layer to 0;
when the target watching column of the watching layer is not empty, and a second original address has been recorded in the target watching column of the watching layer, the hot data tracking device determines whether the access bit of the second original address recorded in the watching layer is 0 or 1,
when the access bit of the second original address is 0, the hot data tracking device records the first original address to the original address item of the target watching column of the watching layer, and sets the access bit of the first original address recorded in the watching layer to 0; and
when the access bit of the second original address is 1, the hot data tracking device sets the access bit of the second original address recorded in the target watching column of the watching layer to 0.

2. A management system for managing a memory device, the memory device having a plurality of sub-chips, each of the sub-chips comprising a container area and a data area, the management system comprising:
a central processing unit (CPU) coupled to the memory device, the CPU selecting a target sub-chip among the sub-chips according to respective temperature of the sub-chips;
a hot data tracking device coupled to the CPU, the hot data tracking device comprising a plurality of tracking layers and a watching layer;
wherein, when the CPU intends to access a first original data stored in one of the data areas,
the hot data tracking device acquires a first original address of the first original data from the CPU;
when the hot data tracking device determines that the first original address is recorded in one of the tracking layers, the hot data tracking device indicates the CPU to access a first copied data corresponding to the first original data from the container area of the target sub-chip according to a current tracking layer of the tracking layers recording the first original address; and
when the hot data tracking device determines that the first original address is not recorded in the tracking layers, the CPU reads the first original data in the data area from the first original address;
wherein, the CPU sets a plurality of sub-containers in each of the container areas; and
the tracking layers and the sub-containers have the same number, and are one to one mapping;
wherein, each of the sub-containers comprises a plurality of storage units;
the watching layer comprises a plurality of watching columns, each of the watching columns comprises an original address item and an access bit item;
each of the tracking layers comprises a plurality of tracking columns, each of the tracking columns comprises an access address item, an original address item and an access bit item; and
the tracking columns of each of the tracking layers and the storage units of each of the sub-containers have the same number, and are one to one mapping;
wherein, when the hot data tracking device determines the first original address is recorded in a current watching column in the watching layer, the hot data tracking device determines whether an access bit of the first original address recorded in the watching layer is 0 or 1;
when the access bit of the first original address is 0, the hot data tracking device sets the access bit of the first original address recorded in the watching layer to 1, and the CPU accesses the first original data in the data areas according to the first original address;
when the access bit of the first original address recorded in the watching layer is 1, the hot data tracking device selects a target tracking column among the tracking columns in a next level tracking layer according to the first original address, and determines whether the target tracking column in the next level tracking layer is empty;
when the target tracking column in the next level tracking layer is empty, the hot data tracking device records the first original address to the original address item of the target tracking column in the next level tracking layer, and sets the access bit of the first original address recorded in the next level tracking layer to 0, and clears the current watching column of the watching layer, and indicates the CPU to copy the first original data to a first storage unit according to the access address item of the target tracking column as a first copied data, and indicates the CPU to access the first copied data in the first storage unit;
when the target tracking column of the next level tracking layer is not empty, and a second original address has been recorded in the original address item of the target tracking column of the next level tracking layer, the hot data tracking device determines whether the access bit of the second original address recorded in the next level tracking layer is 0 or 1;
when the access bit of the second original address recorded in the next level tracking layer is 0, the hot data tracking device records the first original address to the original address item of the target tracking column of the next level tracking layer, and records the second original address to the original address item of the current watching column of the watching layer, and sets both of the access bit of the first original address recorded in the next level tracking layer and the second original address recorded in the watching layer to 0, and indicates the CPU to overwrite a second original data by a second copied data stored in the first storage unit, and indicates the CPU to copy the first original data to the first storage unit as the first copied data, and indicates the CPU to access the first copied data in the first storage unit; and when the access bit of the second original address recorded in the next level tracking layer is 1, the hot data tracking device sets the access bit of the second original address recorded in the next level tracking layer to 0, the CPU accesses the first original data according to the first original address; and wherein the first storage unit is corresponding to the access address item of the target tracking column, and the first storage unit is in the sub-container corresponding to the next level tracking layer.

3. A management system for managing a memory device, the memory device having a plurality of sub-chips, each of the sub-chips comprising a container area and a data area, the management system comprising:

a central processing unit (CPU) coupled to the memory device, the CPU selecting a target sub-chip among the sub-chips according to respective temperature of the sub-chips;

a hot data tracking device coupled to the CPU, the hot data tracking device comprising a plurality of tracking layers and a watching layer, wherein, when the CPU intends to access a first original data stored in one of the data areas, the hot data tracking device acquires a first original address of the first original data from the CPU;

when the hot data tracking device determines that the first original address is recorded in one of the tracking layers, the hot data tracking device indicates the CPU to access a first copied data corresponding to the first original data from the container area of the target sub-chip according to a current tracking layer of the tracking layers recording the first original address; and when the hot data tracking device determines that the first original address is not recorded in the tracking layers, the CPU reads the first original data in the data area from the first original address;

wherein, the CPU sets a plurality of sub-containers in each of the container areas; and the tracking layers and the sub-containers have the same number, and are one to one mapping;

wherein, each of the sub-containers comprises a plurality of storage units;

the watching layer comprises a plurality of watching columns, each of the watching columns comprises an original address item and an access bit item;

each of the tracking layers comprises a plurality of tracking columns, each of the tracking columns comprises an access address item, an original address item and an access bit item; and the tracking columns of each of the tracking layers and the storage units of each of the sub-containers have the same number, and are one to one mapping;

wherein, when the first original address is recorded in a current tracking column of a current tracking layer of the tracking layers, the hot data tracking device determines whether an access bit of the first original address recorded in the current tracking layer is 0 or 1;

when the access bit of the first original address recorded in the current tracking layer is 0, the hot data tracking device sets the access bit of the first original address recorded in the current tracking layer to 1, the hot data tracking device indicates the CPU to access the first copied data in a second storage unit;

when the access bit of the first original address recorded in the current tracking layer is 1, the hot data tracking device selects a target tracking column among the tracking columns in a next level tracking layer according to the first original address, and determines whether the target tracking column of the next level tracking layer is empty;

when the target tracking column of the next level tracking layer is empty, the hot data tracking device records the first original address to the original address item of the target tracking column of the next level tracking layer, and sets the access bit of the first original address recorded in the next level tracking layer to 0, and clears the current tracking column of the current tracking layer, and indicates the CPU to move the first copied data stored in the second storage unit to a third storage unit according to the access address item of the target tracking column of the next level tracking layer, and indicates the CPU to access the first copied data in the third storage unit;

when the target tracking column of the next level tracking layer is not empty, and a second original address has been recorded in the original address item of the target tracking column of the next level tracking layer, the hot data tracking device determines whether the access bit of the second original address recorded in the next level tracking layer is 0 or 1;

when the access bit of the second original address recorded in the next level tracking layer is 1, the hot data tracking device sets the access bit of the second original address recorded in the next level tracking layer to 0, and indicates the CPU to access the first copied data in the second storage unit according to the access address item of the current tracking column of the current tracking layer; and when the access bit of the second original address recorded in the next level tracking layer is 0, the hot data tracking device records the first original address to the original address item of the target tracking column of the next level tracking layer, and records the second original address to the original address item of the current tracking column of the current tracking layer, and sets both of the access bit of the first original address recorded in the next level tracking layer and the second original address recorded in the current tracking layer to 0, and indicates the CPU to exchange a second copied data in the third storage unit with the first copied data stored in the second storage unit according to the access address items of the target tracking column of the next level tracking layer and the current tracking column of the current tracking column, and indicates the CPU to access the first copied data in the third storage unit; and wherein the second storage unit is corresponding to the access address item of the current tracking column, and the second storage unit is in the sub-container corresponding to the tracking layer recorded the first original address, the third storage unit is corresponding to the access address item of the target tracking column, and the third storage unit is in the sub-container corresponding to the next level tracking layer.

4. A management method for managing a memory device, the memory device having a plurality of sub-chips, each sub-chip comprising a container area and a data area, the management method comprising:

a central processing unit (CPU) selecting a target sub-chip among the sub-chips according to the respective temperature of the sub-chips;

when a first original data stored in one of the data areas is intended to be accessed by the CPU, a hot data tracking device acquiring a first original address of the first original data from the CPU;

when the first original address is determined as being recorded in one of a plurality of tracking layers, the CPU accessing a first copied data corresponding to the first original data in the container area of the target sub-chip according to a current tracking layer of the tracking layers recorded the first original address; and when the first original address is determined as being not recorded in the tracking layers, the CPU reading the first original data in the data area from the first original address;

wherein, a plurality of sub-containers are set in each of the container areas; and the tracking layers and the sub-containers have the same number, and are one to one mapping;

wherein, each of the sub-containers comprises a plurality of storage units, each of the tracking layers comprises a plurality of tracking columns, each of the tracking columns comprises an access address item, an original address item and an access bit item, the tracking columns of each of the tracking layers and the storage units of each of the sub-containers have the same, and are one to one mapping;

when the first original address is determined as being not recorded in a watching layer and the tracking layers, the hot data tracking device selecting a target watching column among the watching columns by utilizing a hash value of the first original address according to the first original address, and the hot data tracking device determining whether the target watching column is empty, wherein the watching layer comprises a plurality of watching columns, each of the watching columns comprises an original address item and an access bit item;

when the target watching column of the watching layer is empty, the hot data tracking device recording the first original address to the original address item of the target watching column of the watching layer, and the hot data tracking device setting the access bit of the first original address recorded in the watching layer to 0;

when the target watching column of the watching layer is not empty, and a second original address has been recorded in the target watching column of the watching layer, the hot data tracking device determining whether the access bit of the second original address recorded in the watching layer is 0 or 1, when the access bit of the second original address recorded in the watching layer is 0, the hot data tracking device recording the first original address to the original address item of the target watching column of the watching layer, and the hot data tracking device setting the access bit of the first original address recorded in the watching layer to 0; and when the access bit of the second original address recorded in the watching layer is 1, the hot data tracking device setting the access bit of the second original address recorded in the watching layer to 0.

5. The management method according to claim 4, further comprising:

when the first original address is determined as being recorded in a current watching column in the watching layer, the hot data tracking device determining whether an access bit of the first original address recorded in the watching layer is 0 or 1;

when the access bit of the first original address recorded in the watching layer is 0, the hot data tracking device setting the access bit of the first original address recorded in the watching layer to 1, the CPU accessing the first original data in the data areas according to the first original address;

when the access bit of the first original address recorded in the watching layer is 1, the hot data tracking device selecting a target tracking column among the tracking columns in a next level tracking layer according to the first original address, and the hot data tracking device determining whether the target tracking column of the next level tracking layer is empty;

when the target tracking column of the next level tracking layer is empty, the hot data tracking device recording the first original address to the original address item of the target tracking column of the next level tracking layer, the hot data tracking device setting the access bit of the first original address recorded in the next level tracking layer to 0, the hot data tracking device clearing the current watching column of the watching layer, the CPU copying the first original data to a first storage unit according to the access address item of the target tracking column of the next level tracking layer as a first copied data, and the CPU accessing the first copied data in the first storage unit;

when the target tracking column of the next level tracking layer is not empty and the second original address has been recorded in the original address item of the target tracking column, the hot data tracking device determining whether the access bit of the second original address record in the next level tracking layer is 0 or 1;

when the access bit of the second original address recorded in the next level tracking layer is 0, the hot data tracking device recording the first original address to the original address item of the target tracking column of the next level tracking layer, the hot data tracking device recording the second original address to the original address item of the current watching column of the watching layer, the hot data tracking device setting both of the access bit of the first original address recorded in the next level tracking layer and the second original address recorded in the watching layer to 0, the CPU overwriting a second original data by a second copied data stored in the first storage unit, copying the first original data to the first storage unit as the first copied data, and the CPU accessing the first copied data in the first storage unit; and when the access bit of the second original address is 1, the hot data tracking device setting the access bit to 0 and accessing the first original data according to the first original address;

wherein the first storage unit is corresponding to the access address item of the target tracking column, and the first storage unit is in the sub-container corresponding to the next level tracking layer.

6. The management method according to claim 4, further comprising:

when the first original address is recorded in a current tracking column of a current tracking layer of the tracking layers, the hot data tracking device determining whether an access bit of the first original address record in the current tracking layer is 0 or 1;

when the access bit of the first original address record in the current tracking layer is 0, the hot data tracking device setting the access bit of the first original address recorded in the current tracking layer to 1 and the CPU accessing the first copied data in a second storage unit;

when the access bit of the first original address recorded in the current tracking layer is 1, the hot data tracking device selecting a target tracking column among the tracking columns in a next level tracking layer according to the first original address, and the hot data tracking device determining whether the target tracking column of the next level tracking layer is empty;

when the target tracking column of the next level tracking layer is empty, the hot data tracking device recording the first original address to the original address item of the target tracking column of the next level tracking layer, the hot data tracking device setting the access bit of the first original address recorded in the next level tracking layer to 0, the hot data tracking device clearing the current tracking column of the current tracking layer, the CPU moving the first copied data stored in the second storage unit to a third storage unit according to the access address item of the target tracking column, and the CPU accessing the first copied data in the third storage unit;

when the target tracking column of the next level tracking layer is not empty and the second original address has been recorded in the original address item of the target tracking column of the next level tracking layer, the hot data tracking device determining whether the access bit of the second original address recorded in the next level tracking layer is 0 or 1;

when the access bit of the second original address recorded in the next level tracking layer is 1, the hot data tracking device setting the access bit of the second original address recorded in the next level tracking layer to 0 and the CPU accessing the first copied data in the second storage unit; and when the access bit of the second original address recorded in the next level tracking layer is 0, the hot data tracking device recording the first original address to the original address item of the target tracking column of the next level tracking layer, the hot data tracking device recording the second original address to the original address item of the current tracking column of the current tracking layer, the hot data tracking device setting both of the access bit of the first original address recorded in the next level tracking layer and the second original address recorded in the current tracking layer to 0, the CPU exchanging a second copied data in the third storage unit with the first copied data stored in the second storage unit according to the access address items of the target tracking column of the next level tracking layer and the current tracking column of the current tracking layer, and the CPU accessing the first copied data in the third storage unit;

wherein the second storage unit is corresponding to the access address item of the current tracking column, and the second storage unit is in the sub-container corresponding to the current tracking layer, the third storage unit is corresponding to the access address item of the target tracking column, and the third storage unit is in the sub-container corresponding to the next level tracking layer.

* * * * *